US008541789B2

(12) United States Patent
Yao et al.

(10) Patent No.: US 8,541,789 B2

(45) Date of Patent: Sep. 24, 2013

(54) LIGHT-EMITTING DEVICE WITH PATTERNED CURRENT DIFFUSION LAYER

(75) Inventors: Chiu Lin Yao, Hsinchu (TW); Ya Ian Yang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 235 days.

(21) Appl. No.: 12/949,863

(22) Filed: Nov. 19, 2010

(65) Prior Publication Data

US 2011/0121287 A1 May 26, 2011

(30) Foreign Application Priority Data

Nov. 20, 2009 (TW) .............................. 98139665 A

(51) Int. Cl.
*H01L 27/15* (2006.01)

(52) U.S. Cl.
USPC ................................ 257/79; 257/101; 438/22

(58) Field of Classification Search
USPC ........................................................... 257/79
See application file for complete search history.

(56) References Cited

U.S. PATENT DOCUMENTS

| | | | | |
|---|---|---|---|---|
| 6,462,358 | B1 * | 10/2002 | Lin et al. | 257/99 |
| 2001/0016366 | A1 * | 8/2001 | Sasaki et al. | 438/24 |
| 2004/0124428 | A1 * | 7/2004 | Lin et al. | 257/90 |
| 2005/0116309 | A1 * | 6/2005 | Ohyama et al. | 257/431 |
| 2007/0215882 | A1 * | 9/2007 | Son | 257/79 |

FOREIGN PATENT DOCUMENTS

| | | | |
|---|---|---|---|
| JP | 10214996 | A | 11/1998 |
| JP | 2000357819 | A * | 12/2000 |
| JP | 2007-243189 | A | 9/2007 |
| TW | 200939548 | A | 9/2009 |

* cited by examiner

*Primary Examiner* — Ajay K Arora
(74) *Attorney, Agent, or Firm* — Patterson & Sheridan, LLP

(57) ABSTRACT

Disclosed is a light-emitting device including a permanent substrate, an adhesive layer on the permanent substrate, a current diffusion layer on the adhesive layer, and a semiconductor stack layer on the current diffusion layer. The current diffusion layer has an etched portion and an unetched portion, wherein the etched and unetched portions have a horizontal height difference. The horizontal height difference and the current diffusion layer thickness have a ratio of 20:100 to 70:100.

16 Claims, 8 Drawing Sheets

LIGHT-EMITTING DEVICE WITH PATTERNED CURRENT DIFFUSION LAYER

REFERENCE TO RELATED APPLICATION

This application claims the right of priority based on Taiwan application Serial No. 098139665, filed on Nov. 20, 2009, and the content of which is hereby incorporated by reference.

TECHNICAL FIELD

The application relates to light-emitting devices and methods for manufacturing the same, and more particularly to light-emitting devices including a current diffusion layer and method for manufacturing the same.

DESCRIPTION OF BACKGROUND ART

Optoelectronic devices, e.g. light-emitting diodes, include an active layer to emit light of specific wavelength. The active layer can be a semiconductor epitaxial structure, such as homostructure, single heterostructure (SH), double heterostructure (DH), multiple quantum well (MQW), or the likes. Because the light-emitting diodes have excellent optoelectronic properties: low power consumption, long lifetime, high impact resistance, small volume, fast response rate, and stable emission wavelength, they are usually applied in household appliances, instrumental indicators, light sources of optoelectronic products, optoelectronic communications, and the likes.

SUMMARY OF THE DISCLOSURE

A light-emitting device in accordance with an embodiment of the application includes a permanent substrate; an adhesive layer on the permanent substrate; a current diffusion layer on the adhesive layer, wherein the current diffusion layer has an etched portion and an unetched portion, and the etched and unetched portions have a horizontal height difference; and a semiconductor stack layer on the current diffusion layer, wherein the horizontal height difference is about 20% to 70% of the thickness of the current diffusion layer A backlight module apparatus in accordance with an embodiment of the application includes a light source apparatus including the described light-emitting device; an optical device in an optical path of the light source apparatus; and a power supply system for providing electrical power to the light source apparatus.

An illumination apparatus in accordance with an embodiment of the application includes a light source apparatus including the light-emitting device as mentioned above; a power supply system for providing electrical power to the light source apparatus; and a control device for controlling the electricity input to the light source apparatus or not.

DETAILED DESCRIPTION OF PREFERRED EMBODIMENTS

The embodiments are described hereinafter in accompany with drawings.

The disclosure is about a light-emitting device including a current diffusion layer and a method for manufacturing the same. The current diffusion layer has an etched portion and an unetched portion, and the etched and unetched portions have a horizontal height difference therebetween. The horizontal height difference is about 20% to 70% of the thickness of and the current diffusion layer thickness have a ratio of 20:100 to 70:100. The following disclosure is described according to FIGS. 1 to 8 for further details.

Figure 1:
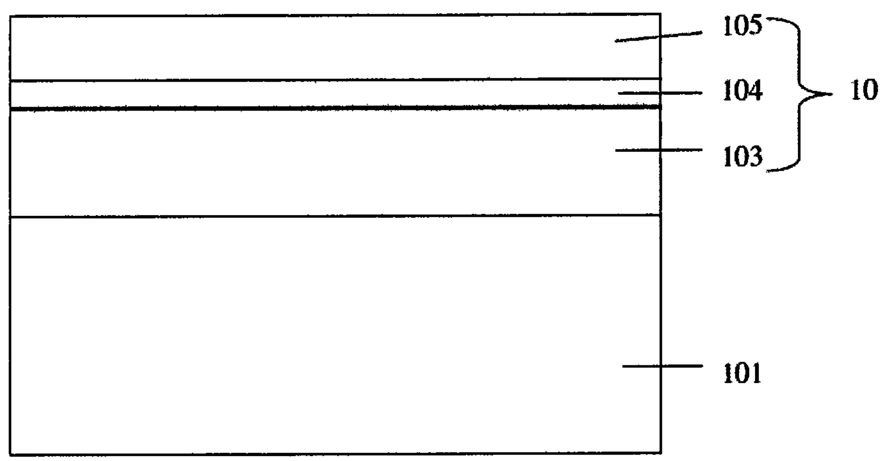
FIGS. 1 to 4 illustrate cross sections of a light-emitting device during manufacturing processes in accordance with a first embodiment of the application.

FIGS. 1 to 4 illustrate cross sections of a light-emitting device during manufacturing processes in accordance with a first embodiment of the application. As shown in FIG. 1, a light-emitting device 100 (e.g. light-emitting diode) includes a growth substrate 101 such as GaAs. Subsequently, a semiconductor stack layer 10 is formed on the growth substrate 101 by an epitaxy process, e.g. metal organic chemical vapor deposition (MOCVD), liquid phase epitaxy (LPE), molecular beam epitaxy (MBE), or the likes. The semiconductor stack layer 10 includes a first type semiconductor layer 103 such as an n-type $Al_xGa_yIn_{(1-x-y)}P$ layer, an active layer 104 such as a multiple quantum well structure of an $Al_xGa_yIn_{(1-x-y)}P$ layer, and a second type semiconductor layer 105 such as a p-type $Al_xGa_yIn_{(1-x-y)}P$ layer. The ratio x, ratio y, and sum of x and y are greater than or equal to 0 and less than or equal to 1, respectively. In addition, the active layer 104 can be a stack structure such as homostructure, single heterostructure (SH), double heterostructure (DH), or single quantum well.

Figure 2:
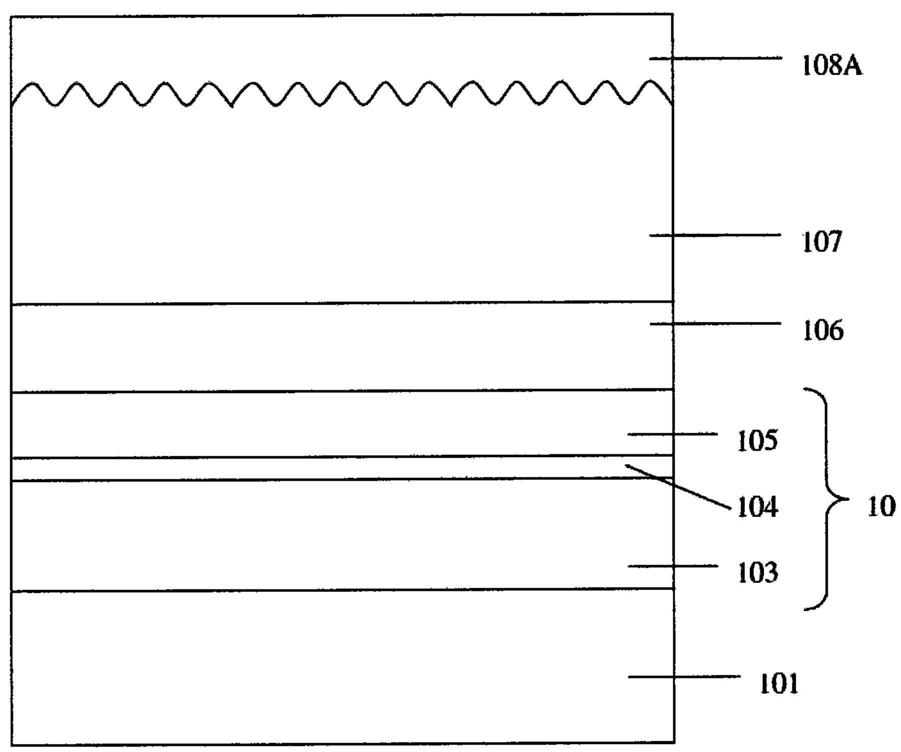

As shown in FIG. 2, a middle layer 106 and a current diffusion layer 107 are sequentially formed on the semiconductor stack layer 10. In this embodiment, the middle layer 106 can be GaP or ZnO. Furthermore, the middle layer 106 can be doped by Mg and Zn with a doping concentration of $D_1$. The current diffusion 107 can be GaP or ZnO. Furthermore, the current diffusion 107 can be doped by Mg and Zn with a doping concentration of $D_2$. In this embodiment, the current diffusion layer 107 has a thickness greater than or equal to 4 μm. The band gap of the current diffusion layer 107 is greater than the band gap of any layer in the semiconductor stack layer 10. The doping concentration $D_2$ is greater than or equal to $5\times10^{17}/cm^3$, while $D_1$ is less than or equal to $D_2/3$. The current diffusion layer 107 is optionally etched to form a specific pattern, thereby forming a rough surface thereon. A first transparent adhesive layer 108A can be further applied on the current diffusion layer 107 to improve the adhesion between the current diffusion layer 107 and a permanent substrate described below.

Figure 3:
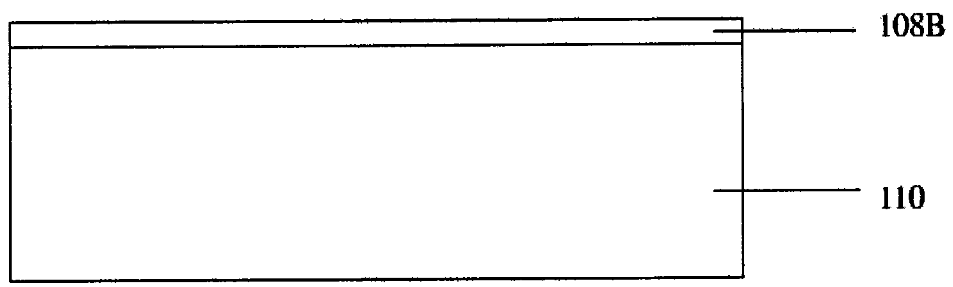

Next, a second transparent adhesive layer 108B is formed on a permanent substrate 110 as shown in FIG. 3. The permanent substrate 110 is preferably a transparent insulation substrate, such as glass, sapphire, lithium niobate, gallium nitride, zinc oxide, and the likes. The first transparent adhesive layer 108A and the second transparent adhesive layer 108B can be polymer, oxide, nitride, or diamond. The described polymer includes benzo-cyclo-butene (BCB), epoxy resin, and the likes. The oxide includes $TiO_2$, $Ti_2O_5$, $Ta_2O_3$, ZnO, or $Al_2O_3$. The nitride includes $SiON_x$, GaN, or AlN.

Figure 4:
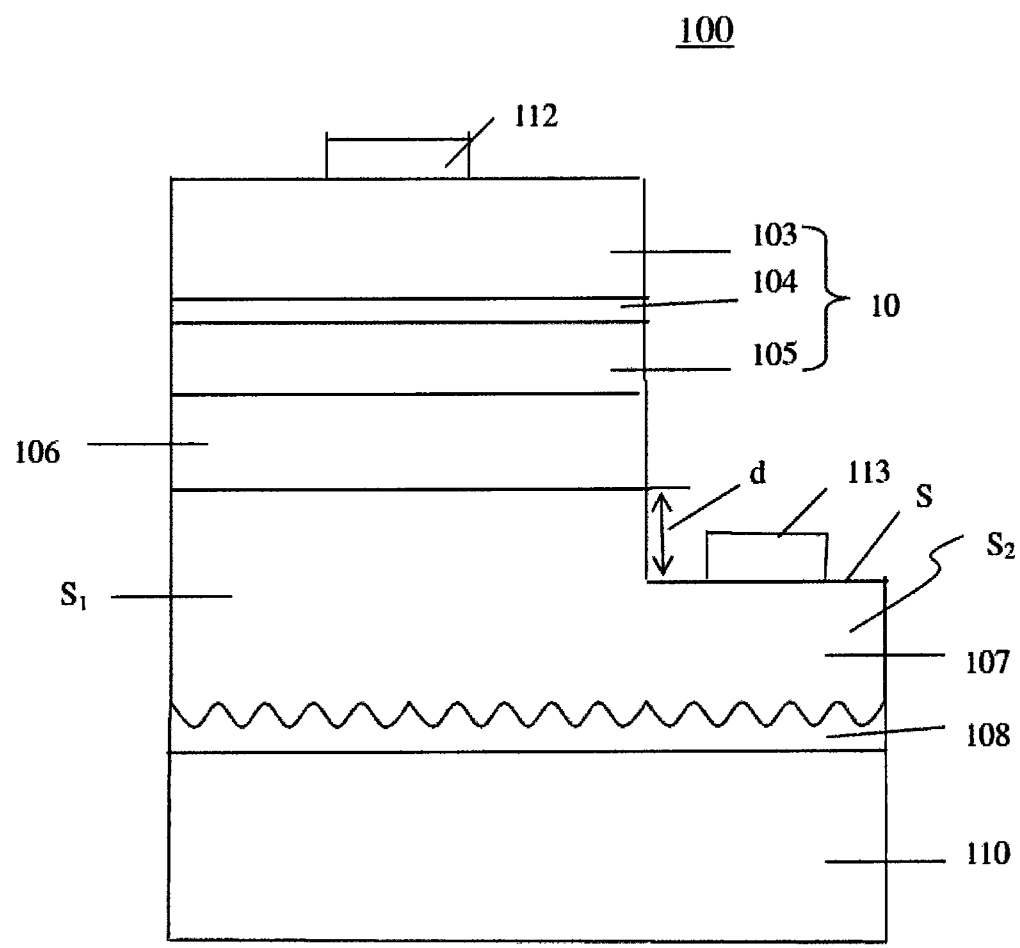

Next, the first transparent adhesive layer 108A of the structure in FIG. 2 is directly bonded to the second transparent adhesive layer 108B of the structure in FIG. 3, as shown in FIG. 4. The first transparent adhesive layer 108A and the second transparent adhesive layer 108B form a single transparent adhesive layer 108 in this step. The growth substrate (not shown in FIG. 4) is then removed by etching, chemical mechanical polish (CMP), or the likes, thereby exposing a surface of the first type semiconductor layer 103. The exposed first type semiconductor layer 103 is optionally etched to form a specific pattern, thereby forming a rough surface (not shown) thereon.

As shown in FIG. 4, part of the semiconductor stack layer 10, part of the middle layer 106, and part of the current diffusion layer 107 are etched downward in sequence to expose a surface S of the current diffusion layer 107 so the current diffusion layer 107 is divided into two portions: an unetched portion $S_1$ and an etched portion $S_2$, wherein the portions $S_1$ and $S_2$ have a horizontal height difference d therebetween. The horizontal height difference d is about 20% to 70% of the thickness of the current diffusion layer thickness. In other words, the difference between the thickness of the etched portion $S_2$ and the thickness of the unetched portion $S_1$ is about 20% to 70% of the thickness of the unetched portion $S_1$.

Next, a first electrode 112 is formed on the first type semiconductor layer 103, and a second electrode 113 is formed on the surface S of the etched portion $S_2$ in the current diffusion layer 107, respectively. The forming methods of the electrodes 112 and 113 can be thermal evaporation, e-beam evaporation, ionic sputtering, or the likes. As such, the light-emitting device 100 is completed. When the light-emitting device 100 is operated, the first electrode 112 and the second electrode 113 are electrically connected to a power supply system (not shown), and a current is injected to the second electrode 113. The current is laterally diffused to the whole current diffusion layer 107 via the etched portion $S_2$. The diffused current flows through the middle layer 106 and the second type semiconductor layer 105, and finally flows into the whole active layer 104. Therefore, the problem of current confinement under the electrode can be solved, and the illumination efficiency of the light-emitting device is correspondingly improved.

Figure 5:
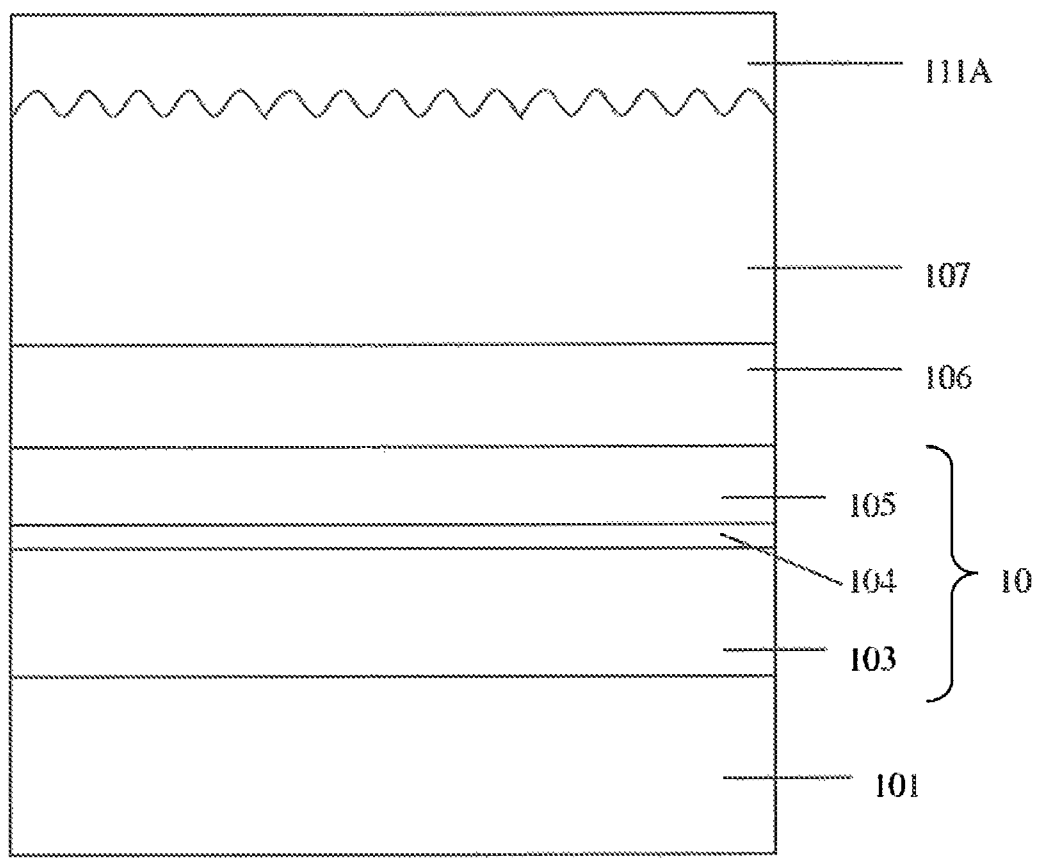
FIGS. 5 to 7 illustrate cross sections of a light-emitting device during manufacturing processes in accordance with a second embodiment of the application.
Figure 6:
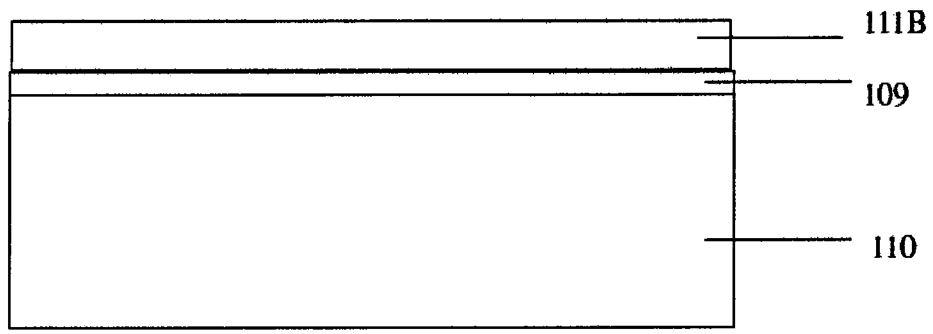

As shown in FIG. 2, the current diffusion layer 107 is etched to form a specific pattern, thereby forming a rough surface thereon. As shown in FIG. 5, a metal adhesive layer 111A can be further formed on the current diffusion layer 107 to improve the adhesion between the current diffusion layer 107 and a permanent substrate described below. Next, a reflection layer 109 and a second metal adhesive layer 111B are formed on the permanent substrate 110, as shown in FIG. 6. The permanent substrate 110 is an opaque insulation substrate, such as a ceramic substrate. In one embodiment, the reflection layer 109 can be metal material, such as aluminum, gold, platinum, zinc, silver, nickel, germanium, indium, tin, or alloys thereof. In another embodiment, the reflection layer 109 can be multi-layered structures of metal and oxide, such as indium tin oxide/silver (ITO/Ag), indium tin oxide/aluminum oxide/silver ($ITO/AlO_x/Ag$), indium tin oxide/titanium oxide/silicon oxide ($ITO/TiO_x/SiO_x$), titanium oxide/silicon oxide/aluminum ($TiO_x/SiO_x/Al$), indium tin oxide/silicon nitride/aluminum ($ITO/SiN_x/Al$), indium tin oxide/silicon nitride/silver ($ITO/SiN_x/Ag$), indium tin oxide/silicon nitride/aluminum oxide/aluminum ($ITO/SiN_x/Al_2O_3/Al$), or indium tin oxide/silicon nitride/aluminum oxide/silver ($ITO/SiN_x/Al_2O_3/Ag$). The first and second adhesive layers 111A and 111B can be Au, Au—Sn, Sn, In, Au—Ag, or Pb—Sn.

Figure 7:
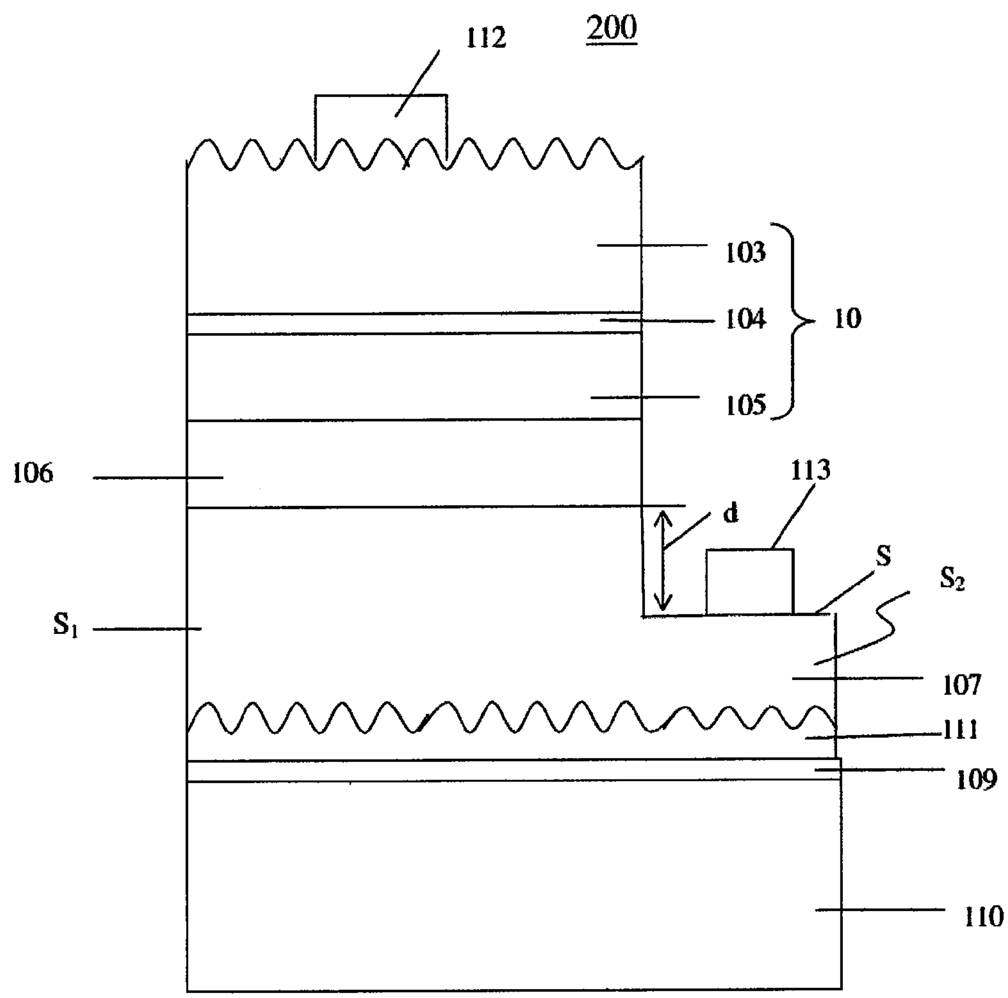

Next, the first metal adhesive layer 111A of the structure in FIG. 5 is directly bonded to the second metal adhesive layer 111B of the structure in FIG. 6, as shown in FIG. 7. The first metal adhesive layer 111A and the second metal adhesive layer 111B form a single metal adhesive layer 111 in this step. The growth substrate (not shown in FIG. 7) is then removed by etching, chemical mechanical polish (CMP), or the likes, thereby exposing a surface of the first type semiconductor layer 103 in the semiconductor stack layer 10. The exposed first type semiconductor layer 103 is optionally etched to form a specific pattern, thereby forming a rough surface (not shown) thereon.

As shown in FIG. 7, part of the semiconductor stack layer 10, part of the middle layer 106, and part of the current diffusion layer 107 are etched downward in sequence to expose a surface S of the current diffusion layer 107 so the current diffusion layer 107 is divided into two portions: an unetched portion $S_1$ and an etched portion $S_2$, wherein the portions $S_1$ and $S_2$ have a horizontal height difference d therebetween. The horizontal height difference d is about 20% to 70% of the thickness of the current diffusion layer thickness. In other words, the difference between the thickness of the etched portion $S_2$ and the thickness of the unetched portion $S_1$ is about 20% to 70% of the thickness of the unetched portion $S_1$.

Next, a first electrode 112 is formed on the first type semiconductor layer 103, and a second electrode 113 is formed on the surface S of the etched portion $S_2$ in the current diffusion layer 107, respectively. The forming method of the electrodes 112 and 113 can be thermal evaporation, e-beam evaporation, ionic sputtering, or the likes. As such, the light-emitting device 200 is completed. When the light-emitting device 200 is operated, the first electrode 112 and the second electrode 113 are electrically connected to a power supply system (not shown), and a current is injected to the second electrode 113. The current is laterally diffused to the whole current diffusion layer 107 via the etched portion $S_2$. The diffused current flows through the middle layer 106 and the second type semiconductor layer 105, and finally flows into the whole active layer 104. Therefore, the problem of current confinement under the electrode can be solved, and the illumination efficiency of the light-emitting device is correspondingly improved.

Figure 8:
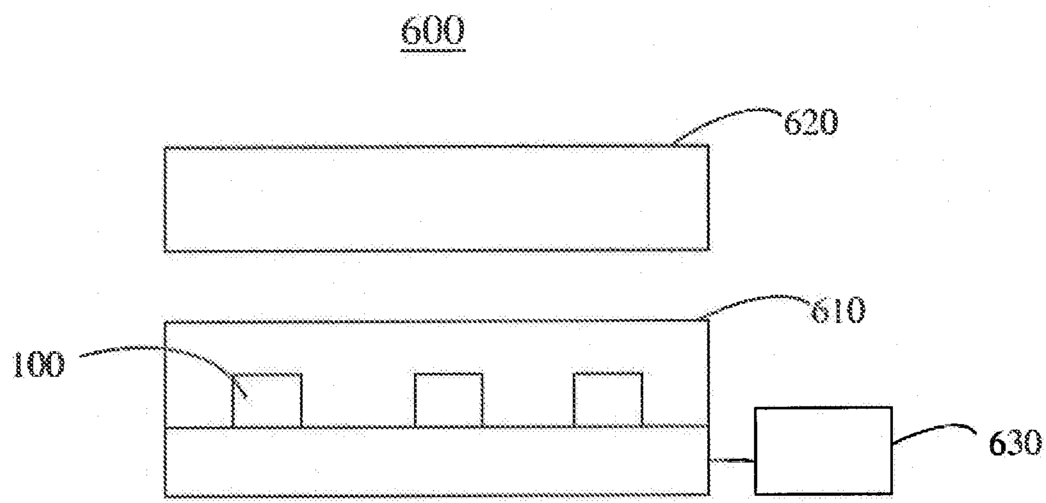
FIG. 8 illustrates a backlight module apparatus in accordance with an embodiment of the application and FIG. 9 illustrates an illumination apparatus in accordance with an embodiment of the application.

FIG. 8 illustrates a backlight module apparatus in accordance with an embodiment of the application. In the backlight module apparatus 600, a light source apparatus 610 including the described light-emitting device 100 or 200, an optical device 620 in an optical path of the light source apparatus 610, and a power supply system 630 for providing electricity to the light source apparatus 610.

Figure 9:
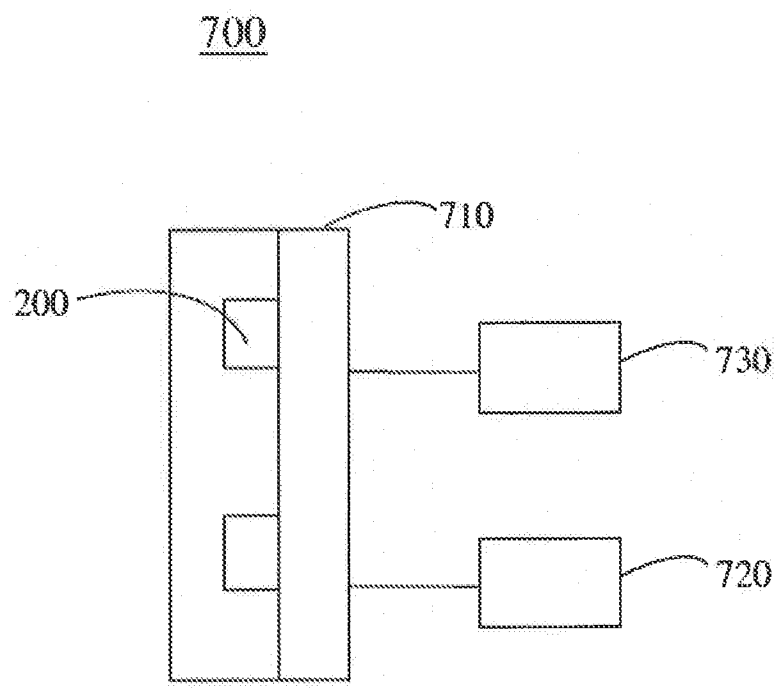

FIG. 9 illustrates an illumination apparatus in accordance with an embodiment of the application. The illumination apparatus 700 can be a vehicle lamp, a street lamp, an electric torch, a road lamp, an indicator lamp, or the likes. In the illumination apparatus 700, a light source apparatus 710 includes the described light-emitting device 100 or 200, a power supply system 720 for providing electricity to the light source apparatus 710, and a control device 730 for controlling the electricity input into the light source apparatus 710 or not.

The foregoing description has been directed to the specific embodiments of this invention. It will be apparent; however, that other alternatives and modifications may be made to the embodiments without escaping the spirit and scope of the invention.

What is claimed is:

1. A light-emitting device, comprising:

a permanent substrate;

an adhesive layer on the permanent substrate;

a current diffusion layer on the adhesive layer, wherein the current diffusion layer has an etched portion and an unetched portion;

a semiconductor stack layer on the current diffusion layer, comprising:

a second type semiconductor layer on the current diffusion layer;

an active layer on the second type semiconductor layer; and a first type semiconductor layer on the active layer, wherein the first type semiconductor layer and the second type semiconductor layer have different electrical properties; and a middle layer between the current diffusion layer and the semiconductor stack layer, wherein the difference between a thickness of the etched portion and a thickness of the unetched portion is about 20% to 70% of the thickness of the unetched portion of the current diffusion layer.

2. The light-emitting device as claimed in claim 1, wherein the permanent substrate is a transparent insulation substrate.

3. The light-emitting layer as claimed in claim 2, wherein the adhesive layer is a transparent adhesive layer.

4. The light-emitting device as claimed in claim 1, wherein the permanent substrate is an opaque insulation substrate.

5. The light-emitting layer as claimed in claim 4, wherein the adhesive layer is a metal adhesive layer.

6. The light-emitting layer as claimed in claim 4, further comprising a reflection layer between the permanent substrate and the adhesive layer.

7. The light-emitting layer as claimed in claim 1, wherein the current diffusion layer has a doping concentration greater than or equal to $5\times10^{17}/cm^3$.

8. The light-emitting layer as claimed in claim 1, wherein the current diffusion layer is doped by Mg or Zn.

9. The light-emitting device as claimed in claim 1, wherein a ratio of the doping concentration of the middle layer to the doping concentration of the current diffusion layer is less than or equal to 1:3.

10. The light-emitting layer as claimed in claim 1, wherein the middle layer is doped by Mg or Zn.

11. The light-emitting device as claimed in claim 1, wherein the band gap of the current diffusion layer is greater than the band gap of any layer in the semiconductor stack layer.

12. The light-emitting device as claimed in claim 1, wherein the current diffusion layer comprises GaP or ZnO.

13. The light-emitting device as claimed in claim 1, wherein the middle layer comprises GaP or ZnO.

14. The light-emitting device as claimed in claim 1, wherein the current diffusion layer has a thickness greater than or equal to 4 μm.

15. The light-emitting device as claimed in claim 1, wherein the current diffusion layer has a rough top surface and/or a rough bottom surface.

16. The light-emitting device as claimed in claim 5, wherein the metal adhesive layer is selected form the group consisting of Au, Au—Sn, Sn, In, Au—Ag, and Pb—Sn.

* * * * *